(12) United States Patent
    Okita et al.

(10) Patent No.: US 11,171,228 B2
(45) Date of Patent: Nov. 9, 2021

(54) NITRIDE SEMICONDUCTOR DEVICE AND METHOD FOR MANUFACTURING THE SAME

(71) Applicant: Panasonic Intellectual Property Management Co., Ltd., Osaka (JP)

(72) Inventors: Hideyuki Okita, Toyama (JP); Manabu Yanagihara, Osaka (JP); Masahiro Hikita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 41 days.

(21) Appl. No.: 16/708,051

(22) Filed: Dec. 9, 2019

(65) Prior Publication Data

US 2020/0119178 A1    Apr. 16, 2020

Related U.S. Application Data

(63) Continuation of application No. PCT/JP2018/015785, filed on Apr. 17, 2018.

(30) Foreign Application Priority Data

Jun. 13, 2017  (JP) .............................. JP2017-116040

(51) Int. Cl.
    *H01L 29/778* (2006.01)
    *H01L 29/66* (2006.01)
    (Continued)

(52) U.S. Cl.
    CPC ...... *H01L 29/7787* (2013.01); *H01L 21/0254* (2013.01); *H01L 21/26546* (2013.01);
    (Continued)

(58) Field of Classification Search
    CPC ............. H01L 29/7787; H01L 29/2003; H01L 29/205; H01L 29/207; H01L 29/42316;
    (Continued)

(56) References Cited

U.S. PATENT DOCUMENTS

| 9,076,854 B2 | 7/2015 | Liu et al. |
| 9,117,890 B2 | 8/2015 | Kim et al. |

(Continued)

FOREIGN PATENT DOCUMENTS

| JP | H9-246527 A | 9/1997 |
| JP | 4041075 B2 | 1/2008 |

(Continued)

OTHER PUBLICATIONS

International Search Report issued in corresponding International Patent Application No. PCT/JP2018/015785, dated Jun. 26, 2018, with English translation.

*Primary Examiner* — Natalia A Gondarenko
(74) *Attorney, Agent, or Firm* — McDermott Will & Emery LLP

(57) ABSTRACT

A nitride semiconductor device includes: a substrate; a first nitride semiconductor layer disposed above the substrate; a second nitride semiconductor layer disposed above the first nitride semiconductor layer and having a band gap larger than a band gap of the first nitride semiconductor layer; a third nitride semiconductor layer selectively disposed above the second nitride semiconductor layer and containing a p-type first impurity element; a high resistance region disposed in the third nitride semiconductor layer, the high resistance region containing a second impurity element and having a specific resistance higher than a specific resistance of the third nitride semiconductor layer; and a gate electrode (Continued)

disposed above the high resistance region, wherein an end of the high resistance region is inside a surface end of the third nitride semiconductor layer.

19 Claims, 9 Drawing Sheets

(51) Int. Cl.
*H01L 29/20* (2006.01)
*H01L 29/205* (2006.01)
*H01L 29/423* (2006.01)
*H01L 29/207* (2006.01)
*H01L 29/45* (2006.01)
*H01L 21/02* (2006.01)
*H01L 21/265* (2006.01)

(52) U.S. Cl.
CPC ........ *H01L 29/2003* (2013.01); *H01L 29/205* (2013.01); *H01L 29/207* (2013.01); *H01L 29/42316* (2013.01); *H01L 29/452* (2013.01); *H01L 29/66462* (2013.01)

(58) Field of Classification Search
CPC ............. H01L 29/452; H01L 29/66462; H01L 29/7788; H01L 29/0646; H01L 29/1066; H01L 29/7786; H01L 21/2654; H01L 21/0254; H01L 21/26546; H01L 29/06; H01L 29/1608; H01L 29/66075; H01L 29/66242; H01L 29/66318; H01L 29/66431; H01L 29/78684; H01L 21/02447; H01L 21/02378; H01L 21/02389; H01L 21/0262; H01L 2924/1033; H01L 2924/13064; H01L 29/122–127; H01L 29/15–158; H01L 29/6656; H01L 29/6653; H01L 29/66719; H01L 29/778–7789; H01L 29/7816; H01L 29/808; H01L 21/02183; H01L 21/02164; H01L 21/0228; H01L 21/02274; H01L 21/02107; H01L 21/02112; H01L 21/022; H01L 21/02208; H01L 21/823468; H01L 21/823864; H01L 21/823456; H01L 21/82385; H01L 21/02205; H01L 21/02225; H01L 21/0229; H01L 21/2123; H01L 21/0217; H01L 21/28114
USPC ................... 257/76, 190, 194, 192; 438/172
See application file for complete search history.

(56) References Cited

U.S. PATENT DOCUMENTS

| | | | |
|---|---|---|---|
| 9,385,001 | B1 | 7/2016 | He et al. |
| 2005/0110042 | A1* | 5/2005 | Saito .................... H01L 29/4175 257/192 |
| 2005/0189559 | A1 | 9/2005 | Saito et al. |
| 2008/0296618 | A1* | 12/2008 | Suh ........................ H01L 29/432 257/190 |
| 2010/0224911 | A1* | 9/2010 | Okita ................. H01L 29/66462 257/194 |
| 2012/0061729 | A1 | 3/2012 | Shibata et al. |
| 2013/0082276 | A1 | 4/2013 | Park et al. |
| 2013/0256685 | A1 | 10/2013 | Ohki |
| 2014/0097468 | A1 | 4/2014 | Okita et al. |
| 2014/0175455 | A1 | 6/2014 | Tanimoto |
| 2014/0306181 | A1 | 10/2014 | Shin et al. |
| 2016/0197174 | A1 | 7/2016 | Kanechika et al. |
| 2018/0166565 | A1* | 6/2018 | Chen .................... H01L 29/7786 |
| 2019/0123187 | A1* | 4/2019 | Tarumi ................ H01L 29/7786 |

FOREIGN PATENT DOCUMENTS

| | | |
|---|---|---|
| JP | 2011-29247 A | 2/2011 |
| JP | 2013-080894 A | 5/2013 |
| JP | 2013-211481 A | 10/2013 |
| JP | 2014-110345 A | 6/2014 |
| JP | 2014-140024 A | 7/2014 |
| JP | 5707463 B2 | 4/2015 |
| JP | 5731687 B2 | 6/2015 |
| JP | 2016-174140 A | 9/2016 |
| JP | 2016-213388 A | 12/2016 |
| WO | 2013/008422 A1 | 1/2013 |

* cited by examiner

NITRIDE SEMICONDUCTOR DEVICE AND METHOD FOR MANUFACTURING THE SAME

CROSS REFERENCE TO RELATED APPLICATIONS

This application is a U.S. continuation application of PCT International Patent Application Number PCT/JP2018/015785 filed on Apr. 17, 2018, claiming the benefit of priority of Japanese Patent Application Number 2017-116040 filed on Jun. 13, 2017, the entire contents of which are hereby incorporated by reference.

BACKGROUND

1. Technical Field

The present disclosure relates to a structure of a semiconductor device and a method for manufacturing the semiconductor device, in particular, a semiconductor that can be used as a power transistor or the like, particularly a device using a group III nitride semiconductor, and a method for manufacturing the device using a group III nitride semiconductor.

2. Description of the Related Art

Group III nitride semiconductors, particularly GaN and AlGaN, have a high breakdown voltage due to their wide band gap. Moreover, it is possible to easily form a heterostructure such as AlGaN/GaN, and an electron channel (two-dimensional electron gas, 2DEG) with high mobility and high concentration can be generated on the GaN layer side of the AlGaN/GaN interface due to the piezoelectric charge generated from the difference in lattice constant between AlGaN and GaN, and the difference in the band gap. By controlling the two-dimensional electron gas channel, a high electron mobility transistor (HEMT, High Electron Mobility Transistor) can be formed. Due to these characteristics of high breakdown voltage, high speed, and large current, group III nitride semiconductors have been applied to electronic devices such as field effect transistors (FETs) and diodes for power use.

When a group III nitride semiconductor is used for a power-use FET (for example, a GaN-FET), a normally-off operation in which no current flows between the source and the drain when the gate voltage is 0 V is required from the viewpoint of safety. In order to perform a normally-off operation of a GaN-FET, it can be achieved by providing a p-type group III nitride semiconductor between the gate electrode and AlGaN to form a p-n junction immediately under the gate and depleting the 2DEG channel only immediately under the gate. The gate forward voltage (Vf, the forward voltage through which a certain forward current flows between the gate and the source) of this structure is about 3 V (a forward voltage for 100 μA flowing per mm of the gate width between the gate and the source) when the gate electrode is ohmically connected to the p-type group III nitride semiconductor.

In a silicon-based MOS (metal oxide semiconductor) FET for power use, Vf is generally several tens of volts because of sandwiching a thermal oxide film ($SiO_2$) between a gate electrode and a channel. Therefore, the silicon-based MOS-FET has high forward voltage gate reliability, and the drive voltage for driving the gate with a gate driver is also as high as about 10 V. For this reason, the GaN-FET could not be driven by simply replacing the GaN-FET onto a silicon-based MOSFET circuit for power use because a large amount of forward current flowed due to a low Vf of the GaN-FET. For the above reason, a gate driver exclusively for GaN is required for driving the GaN-FET conventionally. In order to drive a GaN-FET with a silicon-based MOSFET driver on a silicon-based MOSFET circuit for power use, Vf of the GaN-FET needs to be at least 7 V.

FIG. 13 shows an example of a cross-sectional structure of semiconductor device 901 described in Japanese Unexamined Patent Application Publication No. 2011-29247. Appropriate buffer layer 2 is formed on an appropriate substrate 1 (Si, etc.), first nitride semiconductor layer 3 (GaN, etc.) to be a channel layer is formed further above buffer layer 2, and second nitride semiconductor layer 4 (AlGaN, etc.) serving as a barrier layer having a band gap larger than a band gap of first nitride semiconductor layer 3 is formed further above first nitride semiconductor layer 3. As a result, a two-dimensional electron gas layer 8 is generated by the band gap difference between second nitride semiconductor layer 4 and first nitride semiconductor layer 3 and the piezoelectric charge in second nitride semiconductor layer 4.

Next, a p-type third nitride semiconductor layer 5 (p-GaN, etc.) is selectively formed on second nitride semiconductor layer 4. Gate electrode 7 that is in Schottky contact with p-type third nitride semiconductor layer 5 is formed above p-type third nitride semiconductor layer 5, and source electrode 9 and drain electrode 10 that are in ohmic contact with second nitride semiconductor layer 4 are formed to be spaced apart on both sides of gate electrode 7.

According to Japanese Unexamined Patent Application Publication No. 2011-29247, it is said that by providing p-type third nitride semiconductor layer 5, a depletion layer by a p-n junction can be formed between gate electrode 7 and two-dimensional electron gas layer 8 to realize a normally-off operation easily, and at the same time, a semiconductor device capable of reducing the gate leakage current by making gate electrode 7 in Schottky contact can be produced.

FIG. 14 shows an example of a cross-sectional structure of semiconductor device 902 described in Japanese Patent No. 4041075. In semiconductor device 902, gate insulating film 16 such as $SiO_2$ is formed between p-type third nitride semiconductor layer 5 and upper gate electrode 7 of semiconductor device 901 described in Japanese Unexamined Patent Application Publication No. 2011-29247. According to Japanese Patent No. 4041075, it is said that the gate current can be made substantially zero by forming gate insulating film 16.

FIG. 15 shows an example of a cross-sectional structure of a semiconductor device 903 described in Japanese Patent No. 5707463. In semiconductor device 903, p-type high resistance region 17 having a thickness of about 10 nm to 20 nm is formed on the entire top surface of p-type third nitride semiconductor layer 5 of semiconductor device 901 described in Japanese Unexamined Patent Application Publication No. 2011-29247 by plasma irradiation. According to Japanese Patent No. 5707463, by forming p-type high resistance region 17, it is said that the flow of the gate current can be suppressed when a positive voltage is applied to the gate electrode.

SUMMARY

However, there are some problems when semiconductor devices 901 to 903 described in the background of the disclosure are used in the power field.

In semiconductor device 901 described in Japanese Unexamined Patent Application Publication No. 2011-29247, since gate electrode 7 that is in Schottky contact with p-type third nitride semiconductor layer 5 is formed, Vf can be higher than Vf when gate electrode 7 that is in ohmic contact is formed. However, since Vf at the gate electrode that is in ohmic contact is about 3 V, even if a voltage corresponding to Schottky barrier is added to a voltage corresponding to ohmic contact, only Vf of about 4 V to 6 V can be obtained. In addition, when the forward voltage is set to 6 V or more in the Schottky contact, gate breakdown occurs, which causes a problem in gate reliability.

Semiconductor device 902 described in Japanese Patent No. 4041075 has a MOS structure because gate insulating film 16 such as $SiO_2$ is formed between p-type third nitride semiconductor layer 5 and upper gate electrode 7, and Vf of 10V or more can be easily obtained. However, since the thermal oxide film cannot be formed in the gate insulating film of the group III nitride semiconductor, an oxide film formed by plasma CVD or an oxide film formed by thermal CVD is formed later. An oxide film formed by plasma CVD has many defect levels. In addition, an oxide film formed by thermal CVD also has many interface states at the interface between the oxide film and the nitride semiconductor, because it is not formed in-situ. Since the power semiconductor device is driven at a high voltage, electrons are trapped at these defect levels and interface states, current collapse (slump) occurs, and there is a problem in reliability.

In semiconductor device 903 described in Japanese Patent No. 5707463, p-type high resistance region 17 having a thickness of about 10 nm to 20 nm is formed on the entire top surface of p-type third nitride semiconductor layer 5 by plasma irradiation. Since p-type high resistance region 17 is sandwiched between gate electrode 7 and p-type third nitride semiconductor layer 5, Vf can be increased. However, since the resistivity is not high in spite of saying high resistance region 17 due to the p-type of high resistance region 17, and the thickness is as quite thin as about 10 nm to 20 nm, the effect of improving Vf is limited and Vf of only about 4 V to 6 V can be obtained.

In addition, although Mg is used as the p-type dopant of p-type third nitride semiconductor layer 5 in semiconductor device 903, an activation annealing process (800° C. or more) in which the Mg—H bond hydrogen is desorbed to activate Mg is essential after the epitaxial growth. In semiconductor device 903, it is necessary to perform activation annealing before the selective dry etching of p-type third nitride semiconductor layer 5 (the heat treatment after the formation of the high resistance region is impossible because it returns the high resistance region to a low resistance). The desorption of hydrogen from the side surface of p-type third nitride semiconductor layer 5 is limited, and the activation rate of Mg is reduced. In other words, since the inactive p-type third nitride semiconductor layer 5 is used, the p-n junction immediately under the gate is not sufficiently formed, and since the channel cannot be depleted, Vth is lowered and normally-off operation becomes difficult.

Furthermore, since the plasma-treated p-type high resistance region 17 covers the entire surface of p-type third nitride semiconductor layer 5, the surface beside gate electrode 7 is not p-type third nitride semiconductor layer 5. For this reason, the amount of the total volume of p-type third nitride semiconductor layer 5 is insufficient, the p-n junction immediately under the gate is not sufficiently formed, and the channel cannot be depleted, so that Vth may be lowered and the normally-off operation may be difficult.

Therefore, a nitride semiconductor device according to the present disclosure is characterized by including a substrate; a first nitride semiconductor layer disposed above the substrate; a second nitride semiconductor layer disposed above the first nitride semiconductor layer and having a band gap larger than a band gap of the first nitride semiconductor layer; a third nitride semiconductor layer selectively disposed above the second nitride semiconductor layer and containing a p-type first impurity element; a high resistance region formed in the third nitride semiconductor layer, the high resistance region containing a second impurity element and having a specific resistance higher than a specific resistance of the third nitride semiconductor layer; and a gate electrode disposed above the high resistance region, wherein an end of the high resistance region is inside a surface end of the third nitride semiconductor layer.

In the nitride semiconductor device according to the present disclosure, the normally-off operation is easily realized, and at the same time, Vf is greatly improved ($\geq 7$ V) because the resistivity of the high resistance region is high. As a result, the MOSFET of the conventional power MOSFET circuit can be driven simply by being transferred to the semiconductor device according to the present disclosure, and can be easily replaced. Furthermore, a low Ron can be obtained with a lower forward gate current in the on-resistance/gate current dependency (Ron-Ig). As a result, the switching operation can be performed with low power consumption, and the switching loss on the circuit can be reduced. Furthermore, since the high resistance region is a semiconductor, the gate reliability is high. In addition, since the high resistance region does not cover the entire surface of the p-type third nitride semiconductor layer, the p-type region can be sufficiently secured, a decrease in Vth is suppressed, and a normally-off operation is facilitated. In addition, the structure allows the activation annealing to be performed after the p-type third nitride semiconductor layer is selectively etched, and allows hydrogen to be desorbed from the side surface of the p-type third nitride semiconductor layer. Activation rate is improved, a decrease in Vth is suppressed, and a normally-off operation is facilitated.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT

Hereinafter, a nitride semiconductor device according to the embodiment will be specifically described with reference to the drawings. Note that each of the variations of the embodiment described below shows a specific example of the present disclosure. The numerical values, shapes, materials, components, arrangement positions and connection forms of the components shown in the following embodiment are merely examples, and are not intended to limit the present disclosure. In addition, among the components in the following embodiments, components that are not described in the independent claims are described as optional components.

Figure 1:
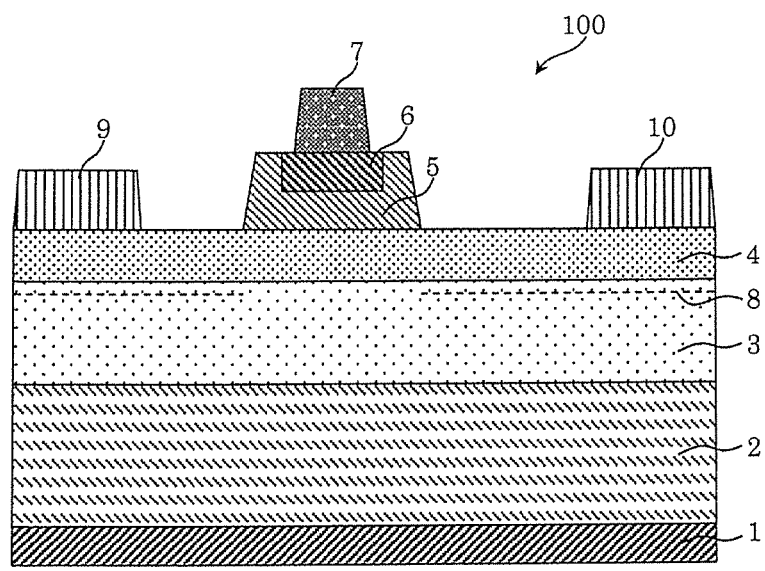
FIG. 1 is a cross-sectional view showing a cross-sectional structure of a nitride semiconductor device according to an embodiment.

FIG. 1 shows a cross-sectional structure of nitride semiconductor device 100 in which an end of the high resistance region is inside the surface of the third nitride semiconductor layer, according to an embodiment. In addition, the present embodiment is described using a group III nitride semiconductor, but the present disclosure is not limited to the group III nitride semiconductor.

Nitride semiconductor device 100 has appropriate buffer layer 2 (for example, single layer or multiple layers of GaN, AlGaN, AlN, InGaN, AlInGaN or the like which is a group III nitride semiconductor) on appropriate Si substrate 1 (in addition, for example, a substrate of Sapphire, SiC, GaN, AlN or the like), first nitride semiconductor layer 3 consisting of GaN (in addition, for example, InGaN, AlGaN, AlInGaN or the like which is a group III nitride semiconductor) on buffer layer 2, and second nitride semiconductor layer 4 consisting of AlGaN (in addition, for example, GaN, InGaN, AlGaN, AlInGaN or the like which is a group III nitride semiconductor) on first nitride semiconductor layer 3. A side surface of third nitride semiconductor layer 5 is exposed.

Nitride semiconductor device 100 has third nitride semiconductor layer 5 containing a p-type first impurity element selectively consisting of p-GaN (in addition, for example, p-InGaN, p-AlGaN, p-AlInGaN or the like which is a group III nitride semiconductor) on second nitride semiconductor layer 4. Second nitride semiconductor layer 4 has a band gap larger than a band gap of first nitride semiconductor layer 3. Furthermore, when second nitride semiconductor layer 4 is AlGaN and first nitride semiconductor layer 3 is GaN, high concentration two-dimensional electron gas layer 8 is generated on the GaN layer side near the AlGaN/GaN interface due to the piezoelectric charge generated from the difference in lattice constant between AlGaN and GaN and the difference in band gap. However, a p-n junction is formed immediately below third nitride semiconductor layer 5 containing the p-type first impurity element, and when the gate voltage is not applied, two-dimensional electron gas layer 8 is depleted to be in the normally-off state.

Nitride semiconductor device 100 has high resistance region 6 which contains a second impurity element and has a specific resistance higher than a specific resistance of third nitride semiconductor layer 5 in a part of third nitride semiconductor layer 5 containing the p-type first impurity element; gate electrode 7 on high resistance region 6; and source electrode 9 and drain electrode 10 each of which is formed apart from gate electrode 7, and electrically connected to two-dimensional electron gas layer 8. Note that a difference between impurity elements in third nitride semiconductor layer 5 and impurity elements in high resistance region 6 is, for example, only the second impurity element.

When second nitride semiconductor layer 4 is AlGaN, for normally-off operation, when the Al composition ratio in second nitride semiconductor layer 4 is 20%, it is necessary for the AlGaN film thickness to be in the range of 10 nm to 20 nm, preferably 15 nm, depending on the threshold voltage (Vth) to be set. In addition, when third nitride semiconductor layer 5 containing the p-type first impurity element is p-GaN, it is only necessary that the film thickness is in the range of 50 nm to 300 nm, preferably 100 nm. When the p-type first impurity element is Mg, it is only necessary that the concentration is in the range of $1 \times 10^{19}$ cm$^{-3}$ to $10 \times 10^{19}$ cm$^{-3}$, preferably $5 \times 10^{19}$ cm$^{-3}$.

It is only necessary that the second impurity element contained in high resistance region 6 is at least one of F, B, Ar, He, Fe, Cr, Zn, Ca and Ti, for example, any element that completely inactivates an n-type or p-type nitride semiconductor and increases resistance such as F and Fe.

Figure 2:
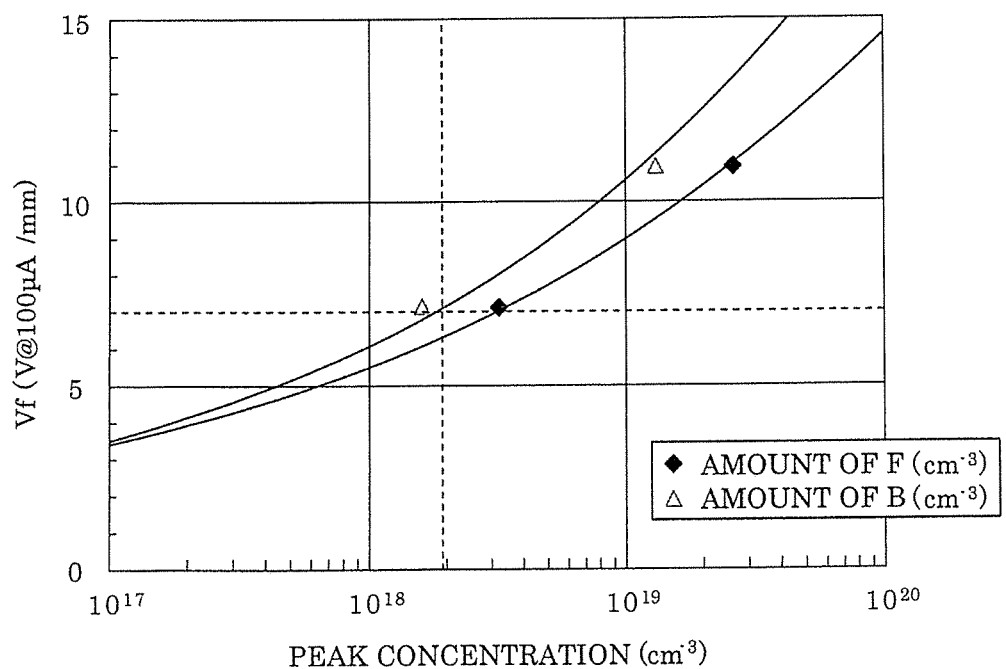
FIG. 2 is a graph showing the dependency of Vf of the nitride semiconductor device according to the embodiment on the second impurity element peak concentration in the high resistance region.

FIG. 2 is a graph showing the dependency of Vf of nitride semiconductor device 100 on the second impurity element peak concentration in high resistance region 6. From FIG. 2, it is only necessary that the peak concentration of the second impurity element is $1\times10^{18}$ cm$^{-3}$ or more, preferably $2\times10^{18}$ cm$^{-3}$ or more in order to inactivate high resistance region 6 and increase the resistance to obtain a sufficiently high Vf of 7 V or more.

Figure 3:
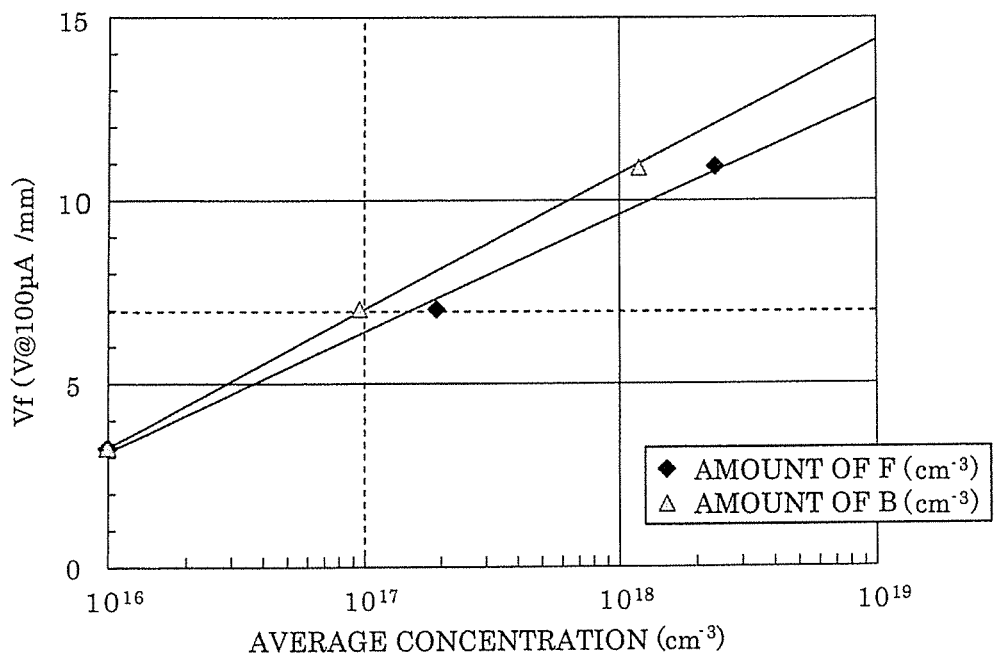
FIG. 3 is a graph showing the dependency of Vf of the nitride semiconductor device according to the embodiment on the second average impurity element concentration in the third nitride semiconductor layer.

FIG. 3 is a graph showing the dependency of Vf of nitride semiconductor device 100 on the second average impurity element concentration in third nitride semiconductor layer 5. Here, the second impurity element average concentration in third nitride semiconductor layer 5 refers to a value obtained by converting the amount of the second impurity element contained per total volume of third nitride semiconductor layer 5 into a concentration. From FIG. 3, the second impurity element average concentration in third nitride semiconductor layer 5 is desirably $1\times10^{17}$ cm$^{-3}$ or more.

High resistance region 6 may be anywhere in third nitride semiconductor layer 5 containing the p-type first impurity element under gate electrode 7. For example, it may be on the outermost surface of third nitride semiconductor layer 5. It may be in the center. It may be mottled (distributed) in third nitride semiconductor layer 5. However, in order to improve Vf efficiently, high resistance region 6 may be on the outermost surface of third nitride semiconductor layer 5 and is in contact with gate electrode 7.

Furthermore, the lateral end portion of high resistance region 6 may be located inside the end portion on the surface side of third nitride semiconductor layer 5. Moreover, although the end portion of the bottom surface of gate electrode 7 may be inside, flush or outside the lateral end portion of high resistance region 6. However, in order to improve Vf efficiently, the end portion of the bottom surface of gate electrode 7 may be inside the lateral end portion of high resistance region 6 (FIG. 1). In other words, the width (dimension in the lateral direction) of gate electrode 7 may be narrower than the width (dimension in the lateral direction) of high resistance region 6. Here, the lateral direction is a direction that crosses nitride semiconductor device 100 through source electrode 9 and drain electrode 10.

Furthermore, in order to inactivate high resistance region 6 and increase the resistance to obtain a sufficiently high Vf of 7 V or more, the thickness of high resistance region 6 containing the second impurity element is 20 nm or more, preferably 70 nm or more. Here, a film thickness containing $1\times10^{17}$ cm$^{-3}$ or more of the second impurity element is defined as a film thickness of high resistance region 6. In order to inactivate high resistance region 6 and increase the resistance to obtain a sufficiently high Vf of 7 V or more, such both conditions may be satisfied that the thickness of high resistance region 6 is 20 nm or more and that the second impurity element peak concentration is $2\times10^{18}$ cm$^{-3}$ or more.

It is only necessary that gate electrode 7 in contact with a part of high resistance region 6 is an electrode made of one metal or a combination of two or more metals such as Ti, Ni, Pd, Pt, Au, W, WSi, Ta, TiN, Al, Mo, Hf, and Zr. However, when a metal that makes a Schottky contact with third nitride semiconductor layer 5 containing the p-type first impurity element is used for gate electrode 7, there is high possibility to cause problems in gate reliability such that the gate is destroyed when a gate voltage of 6 V or more is applied. Therefore, in order to ensure the reliability of the gate, such an electrode may be used for gate electrode 7 as to be in ohmic contact with third nitride semiconductor layer 5 containing the p-type first impurity element, or as to be made of one metal or a combination of two or more metals such as Ni, Pt, Pd, Au, Ti, Cr, In, and Sn, which are metals with a low contact resistance. However, the contact resistance when the electrode that is in ohmic contact with third nitride semiconductor layer 5 containing the p-type first impurity element described above contacts high resistance region 6 may be higher to some extent in order to improve Vf. Specifically, 200 Ωmm or more is desirable.

It is only necessary that source electrode 9 and drain electrode 10 consist of electrodes made of one metal or a combination of two or more metals such as Ti, Al, Mo, and Hf in ohmic contact with any one of two-dimensional electron gas layer 8, second nitride semiconductor layer 4, and first nitride semiconductor layer 3, and are electrically connected to two-dimensional electron gas layer 8. For example, source electrode 9 and drain electrode 10 may be formed on the surface of second nitride semiconductor layer 4. In addition, it is only necessary that source electrode 9 and drain electrode 10 are in contact with a part of two-dimensional electron gas layer 8, second nitride semiconductor layer 4 and first nitride semiconductor layer 3 using a known ohmic recess technique (not shown).

Next, sectional views showing a manufacturing method of this structure are shown in FIGS. 4A to 4F. Note that this manufacturing method has indicated a minimum configuration, and the present disclosure is not limited to this configuration. Moreover, the order of the manufacturing method is not limited to this configuration.

Figure 4A:
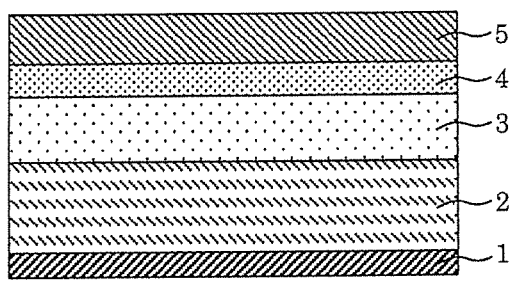
FIG. 4A is a cross-sectional view showing a method for manufacturing the nitride semiconductor device according to the embodiment.

First, appropriate buffer layer 2 (for example, single layer or multiple layers of GaN, AlGaN, AlN, InGaN, AlInGaN or the like which is a group III nitride semiconductor) is formed on Si substrate 1 having an appropriate (111) plane (in addition, for example, a substrate such as Sapphire, SiC, GaN or AlN) using a known epitaxial growth technique such as MOCVD. First nitride semiconductor layer 3 made of GaN (in addition, for example, InGaN, AlGaN, AlInGaN or the like which is a group III nitride semiconductor) is formed on buffer layer 2. Second nitride semiconductor layer 4 made of AlGaN having a band gap larger than a band gap of first nitride semiconductor layer 3 (in addition, for example, GaN, InGaN, AlInGaN or the like which is a group III nitride semiconductor) is formed on first nitride semiconductor layer 3. Third nitride semiconductor layer 5 made of p-GaN containing the p-type first impurity element (in addition, for example, p-InGaN, p-AlGaN, p-AlInGaN or the like which is a III group nitride semiconductor) is continuously formed on second nitride semiconductor layer 3 (FIG. 4A).

Figure 4B:
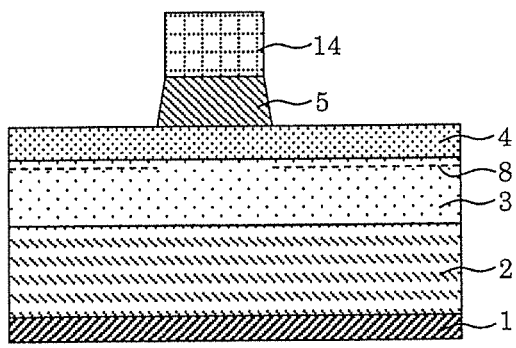
FIG. 4B is a cross-sectional view showing the method for manufacturing the nitride semiconductor device according to the embodiment.

When second nitride semiconductor layer 4 is AlGaN, for a normally-off operation, when the Al composition ratio is 20%, it is necessary that the AlGaN film thickness is in the range of 10 nm to 20 nm, preferably 15 nm, depending on the set threshold voltage (Vth). In addition, when third nitride semiconductor layer 5 containing the p-type first impurity element is p-GaN, it is only necessary that the film thickness is in the range of 50 nm to 300 nm, preferably 100 nm. When the p-type first impurity element is Mg, it is only necessary that the concentration is in the range of 1 to $10\times10^{19}$ cm$^{-3}$, preferably $5\times10^{19}$ cm$^{-3}$. Next, resist pattern 14 is formed using a known photolithography technique, and third nitride semiconductor layer 5 containing the p-type first impurity element is selectively removed using a known dry etching technique (FIG. 4B).

Subsequently, in order to activate Mg, which is a p-type impurity element of third nitride semiconductor layer 5 containing the p-type first impurity element, activation annealing is performed in nitrogen gas at a temperature of 800° C. for about 30 minutes (not shown). The activation annealing is performed after third nitride semiconductor layer 5 containing the p-type first impurity element is selectively removed because the bond of hydrogen deactivating Mg which is a p-type impurity element can be cut off to make hydrogen efficiently desorbed not only from the surface of third nitride semiconductor layer 5 but also from the side surface of third nitride semiconductor layer 5. This improves the Mg activation rate, suppresses the decrease in Vth, and facilitates the normally-off operation. When the activation annealing is performed before third nitride semiconductor layer 5 is selectively removed, the Mg activation rate decreases, Vth decreases, and the normally-off operation becomes difficult.

Figure 4C:
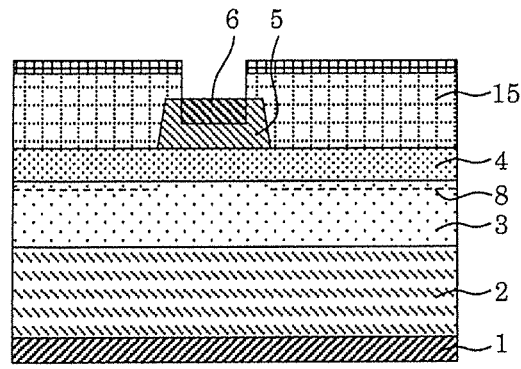
FIG. 4C is a cross-sectional view showing the method for manufacturing the nitride semiconductor device according to the embodiment.

Subsequently, again using a known photolithography technique, resist pattern 15 having an opening on the top surface of third nitride semiconductor layer 5 containing the p-type first impurity element is provided. A second impurity element is implanted into third nitride semiconductor layer 5 by a known ion implantation technique through the opening of resist pattern 15 to form high resistance region 6 having a specific resistance higher than a specific resistance of third nitride semiconductor layer 5 (FIG. 4C).

It is only necessary that the second impurity element contained in high resistance region 6 is an element which completely inactivates the n-type or p-type nitride semiconductor and increases resistance such as one of F, B, Ar, He, Fe, Cr, Zn, Ca and Ti, for example, F or Fe in order to inactivate high resistance region 6 and increase the resistance to obtain a sufficiently high Vf of 7 V or higher. Additionally, in order to inactivate high resistance region 6 and increase the resistance to obtain a sufficiently high Vf of 7 V or higher, it is only necessary that the peak concentration of the second impurity element is $1 \times 10^{18}$ cm$^{-3}$ or higher, preferably $2 \times 10^{18}$ cm$^{-3}$ (FIG. 2). Furthermore, when the amount of the second impurity element described above is converted into an average concentration of the second impurity element contained in entire third nitride semiconductor layer 5 (a value obtained by converting the amount of the second impurity element contained in third nitride semiconductor layer 5 per total volume into a concentration), it is preferably $1 \times 10^{17}$ cm$^{-3}$ or more (FIG. 3).

When F is used as the second impurity element, ion implantation is performed by selecting F, BF$_2$ gas or the like. It is necessary that the acceleration energy for ion implantation is in the range of 10 keV to 100 keV, preferably about 40 keV, and that the dose amount is $1 \times 10^{13}$ cm$^{-2}$ or more, preferably about $5 \times 10^{13}$ cm$^{-2}$. It is not desirable that the implantation depth may penetrate third nitride semiconductor layer 5 and reach second nitride semiconductor layer 4, because two-dimensional electron gas layer 8 immediately below the gate during the on-operation decreases and Vth shifts. Therefore, it is important that the implantation depth of the second impurity element does not exceed the bottom of third nitride semiconductor layer 5, for example, that it stops about 10 nm above the bottom of third nitride semiconductor layer 5 in consideration of process variations.

In addition, the opening of resist pattern 15 needs to be inside the top end of third nitride semiconductor layer 5 selectively formed in order to increase the resistance by ion implantation. When the opening of resist pattern 15 falls outside the top end of third nitride semiconductor layer 5, the resistances of first nitride semiconductor layer 3 and second nitride semiconductor layer 4 are increased by ion implantation. As a result, the on-resistance of the device is greatly deteriorated and the FET does not operate.

Figure 4D:
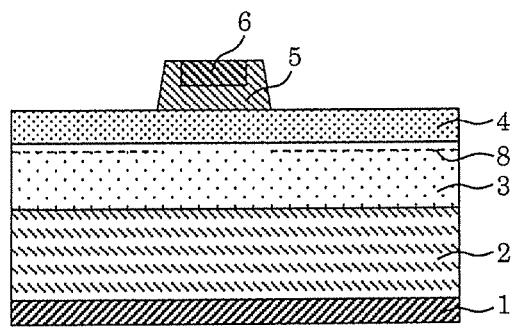
FIG. 4D is a cross-sectional view showing the method for manufacturing the nitride semiconductor device according to the embodiment.

Subsequently, resist pattern 15 is removed using a known oxygen ashing technique, an organic resist removal technique or the like (FIG. 4D).

Figure 4E:
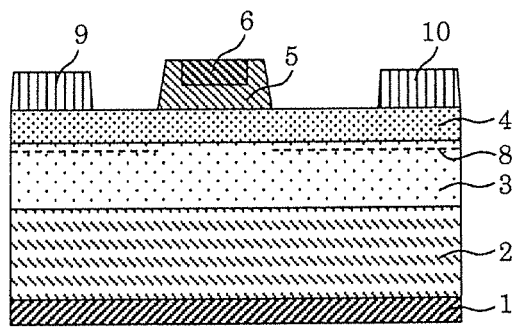
FIG. 4E is a cross-sectional view showing the method for manufacturing the nitride semiconductor device according to the embodiment.

Subsequently, source electrode 9 and drain electrode 10 are formed using a known photolithography technique, vapor deposition technique, lift-off technique, sputtering technique, dry etching technique, and the like (FIG. 4E). It is only necessary that source electrode 9 and drain electrode 10 consist of electrodes made of one metal or a combination of two or more metals such as Ti, Al, Mo and Hf in ohmic contact with any one of two-dimensional electron gas layer 8, second nitride semiconductor layer 4 and first nitride semiconductor layer 3, and are electrically connected to two-dimensional electron gas layer 8. For example, source electrode 9 and drain electrode 10 may be formed on the surface of second nitride semiconductor layer 4. In addition, it is only necessary that source electrode 9 and drain electrode 10 are in contact with a part of two-dimensional electron gas layer 8, second nitride semiconductor layer 4 and first nitride semiconductor layer 3 using a known ohmic recess technique (not shown). Source electrode 9 and drain electrode 10 may be annealed to reduce the contact resistance.

Figure 4F:
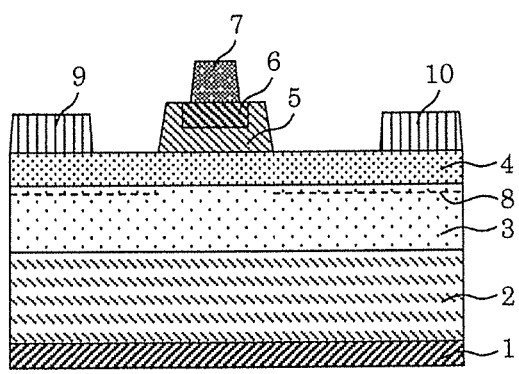
FIG. 4F is a cross-sectional view showing the method of manufacturing the nitride semiconductor device according to the embodiment.

Finally, gate electrode 7 is formed using a known photolithography technique, vapor deposition technique, lift-off technique, sputtering technique, dry etching technique, etc. (FIG. 4F). High resistance region 6 may be anywhere in third nitride semiconductor layer 5 containing the p-type first impurity element under gate electrode 7, for example, on the outermost surface of third nitride semiconductor layer 5. It may be present in the center, and may be present in third nitride semiconductor layer 5 in a mottled (distributed) manner. In order to improve Vf efficiently, however, high resistance region 6 may be on the outermost surface of third nitride semiconductor layer 5 and in contact with gate electrode 7. Moreover, the end portion of the bottom surface of gate electrode 7 may be inside, flush with or outside the lateral end portion of high resistance region 6. However, it may be inside in order to improve Vf efficiently.

It is only necessary that gate electrode 7 in contact with a part of high resistance region 6 consist of an electrode made of one metal or a combination of two or more metals such as Ti, Ni, Pd, Pt, Au, W, WSi, Ta, TiN, Al, Mo, Hf and Zr. However, when a metal that makes a Schottky contact with third nitride semiconductor layer 5 containing the p-type first impurity element is used for gate electrode 7, there is high possibility of problems in reliability such that the gate is destroyed when a gate voltage of 6 V or more is applied. Therefore, in order to ensure the reliability of the gate, an electrode may be used which is in ohmic contact with third nitride semiconductor layer 5 containing the p-type first impurity element or which is made of one metal or a combination of two or more metals such as Ni, Pt, Pd, Au, Ti, Cr, In and Sn. However, the contact resistance when the electrode that is in ohmic contact with third nitride semiconductor layer 5 containing the p-type first impurity element described above contacts high resistance region 6 may be higher to some extent, specifically, 200 Ωmm or more, in order to improve Vf.

The operation of nitride semiconductor device 100 will be described. In the normally-off operation, when gate electrode 7 is 0 V, the depletion layer due to the p-n junction spreads immediately below third nitride semiconductor layer 5, so that two-dimensional electron gas layer 8 does not exist and is in the off state. When a positive gate voltage is applied to gate electrode 7 with source electrode 9 grounded and a positive drain voltage as a load applied to drain electrode 10, the depletion layer is reduced and when the gate voltage exceeds Vth, the drain current begins to flow and the device is turned on.

The effect of nitride semiconductor device 100 will be described. By using nitride semiconductor device 100, a normally-off operation can be easily realized, and at the same time, Vf can be improved to 7V or more, because the resistivity of high resistance region 6 is high. As a result, the MOSFET of the conventional power MOSFET circuit can be driven simply by being transferred to nitride semiconductor device 100, and can be easily replaced. Furthermore, in the on-resistance/gate current dependency (Ron-Ig), a low Ron can be obtained with a lower forward gate current. As a result, the switching operation can be performed with low power consumption, and the switching loss on the circuit can be reduced. Furthermore, since high resistance region 6 is a semiconductor layer, the reliability of the gate is higher than the reliability of a silicon oxide film or the like deposited by plasma CVD or the like. In addition, since high resistance region 6 does not cover the entire surface of p-type third nitride semiconductor layer 5, the p-type region can be sufficiently ensured, a decrease in Vth is suppressed, and a normally-off operation is facilitated. Furthermore, structurally, activation annealing can be performed after p-type third nitride semiconductor layer 5 is selectively etched, and hydrogen from the lateral direction of p-type third nitride semiconductor layer 5 can be desorbed. As a result, the Mg activation rate is improved, the decrease in Vth is suppressed, and the normally-off operation is facilitated.

Next, a nitride semiconductor device according to Variation 1 of the embodiment will be described.

Figure 5:
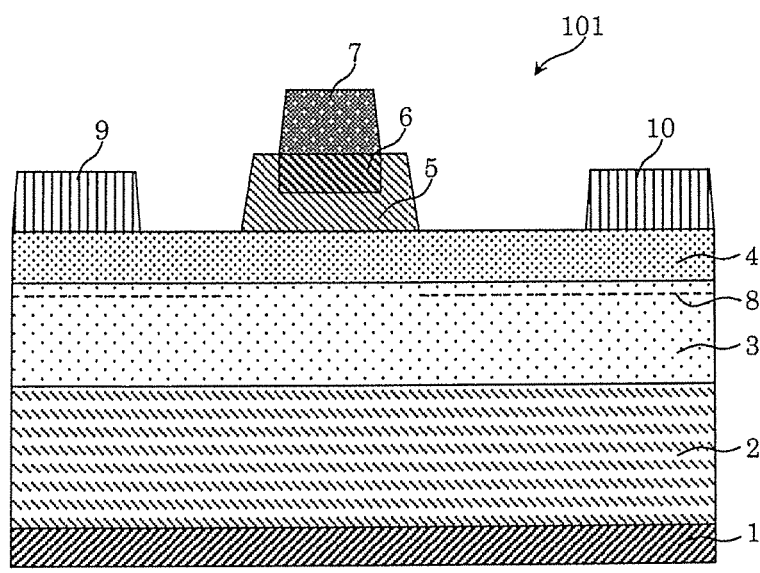
FIG. 5 is a cross-sectional view showing a cross-sectional structure of a nitride semiconductor device according to Variation 1 of the embodiment.

FIG. 5 shows a cross-sectional structure of nitride semiconductor device 101 in which the end portion of high resistance region 6 is inside the surface end of third nitride semiconductor layer 5 and the width of the gate electrode is equal to the width of high resistance region 6, according to Variation 1 of the embodiment. Moreover, although this variation is described using a group III nitride semiconductor, the present disclosure is not limited to the group III nitride semiconductor. Furthermore, this structure shows a minimum configuration, and the present disclosure is not limited to this configuration.

The width of gate electrode 7 in nitride semiconductor device 101 is the same as the width of high resistance region 6 which has specific resistance higher than the specific resistance of third nitride semiconductor layer 5 in nitride semiconductor device 100 shown in FIG. 1. That is, the bottom end of gate electrode 7 is the same as (flush with) the lateral end of high resistance region 6 in the lateral direction. In other words, the width (dimension in the lateral direction) of gate electrode 7 is the same as the width (dimension in the lateral direction) of high resistance region 6. Here, the lateral direction is a direction that crosses nitride semiconductor device 101 through source electrode 9 and drain electrode 10.

In addition to the effects of nitride semiconductor device 100 shown in FIG. 1, using nitride semiconductor device 101 suppresses the decrease in Vth due to a large p-GaN region and further facilitates the normally-off operation while keeping Vf high. Furthermore, since the access from the end of gate electrode 7 to third nitride semiconductor layer 5 containing the p-type first impurity element is close, the gate current can be made to flow minutely. Even if the gate voltage is applied in the forward direction by 6 V or more, it is not destroyed, and the gate reliability is improved.

Next, a nitride semiconductor device according to Variation 2 of the embodiment will be described.

Figure 6:
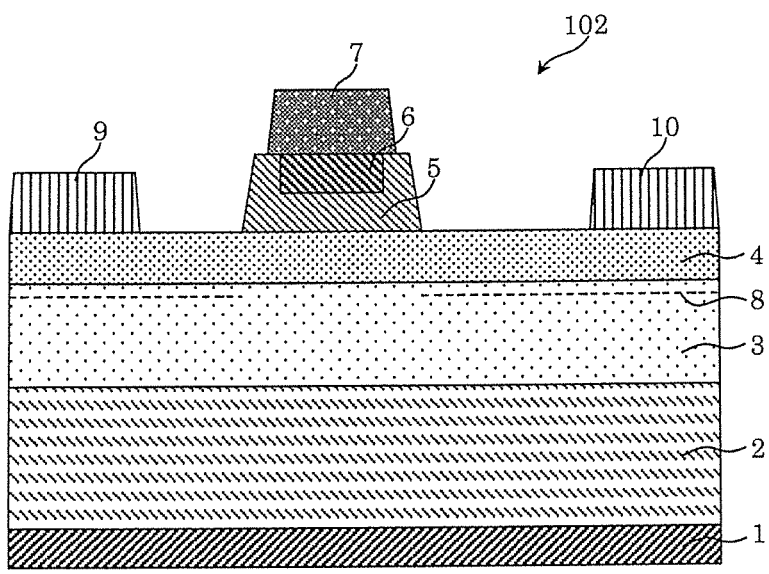
FIG. 6 is a cross-sectional view showing a cross-sectional structure of a nitride semiconductor device according to Variation 2 of the embodiment.

FIG. 6 shows a cross-sectional structure of nitride semiconductor device 102 in which the end portion of high resistance region 6 is inside the surface end of third nitride semiconductor layer 5 and the width of the gate electrode is outside the width of said high resistance region 6, according to Variation 2 of the embodiment. Moreover, although this variation is described using a group III nitride semiconductor, the present disclosure is not limited to the group III nitride semiconductor. Furthermore, this structure shows a minimum configuration, and the present disclosure is not limited to this configuration.

The width of gate electrode 7 in nitride semiconductor device 102 is wider than the width of high resistance region 6 which has specific resistance higher than the specific resistance of third nitride semiconductor layer 5 in nitride semiconductor device 100 shown in FIG. 1. That is, the bottom end of gate electrode 7 is outside the lateral end of high resistance region 6. That is, the outside of gate electrode 7 is in contact with third nitride semiconductor layer 5 containing the p-type first impurity element. In other words, the width (dimension in the lateral direction) of gate electrode 7 is wider than the width (dimension in the lateral direction) of high resistance region 6. Here, the lateral direction is a direction that crosses nitride semiconductor device 102 through source electrode 9 and drain electrode 10.

In addition to the effects of nitride semiconductor device 100 shown in FIG. 1, using nitride semiconductor device 102 suppresses the decrease in Vth due to a further large p-GaN region and facilitates the normally-off operation while keeping Vf high in a certain degree. Furthermore, since the direct access from the end of gate electrode 7 to third nitride semiconductor layer 5 containing the p-type first impurity element is possible, the gate current can be made to flow in a certain degree. Even if the gate voltage is applied in the forward direction by 6 V or more, it is not destroyed, and the gate reliability is further improved.

Next, a nitride semiconductor device according to Variation 3 of the embodiment will be described.

Figure 7:
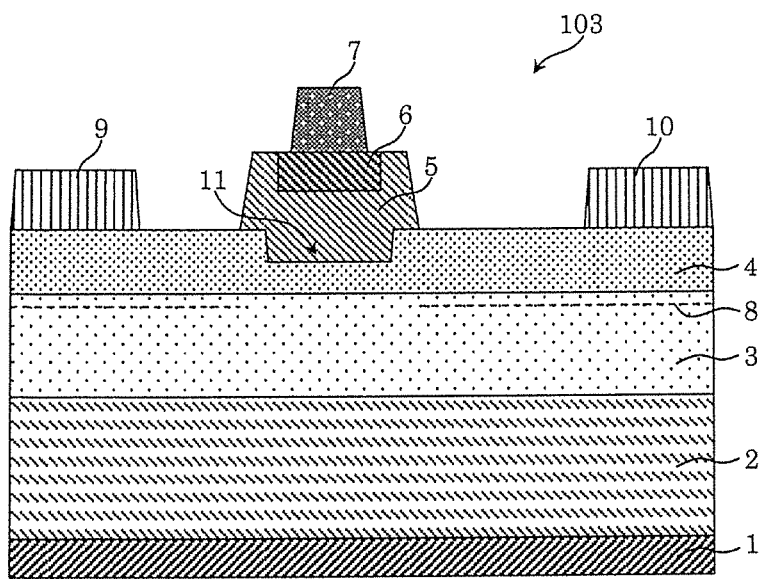
FIG. 7 is a cross-sectional view showing a cross-sectional structure of a nitride semiconductor device according to Variation 3 of the embodiment.

FIG. 7 shows a cross-sectional structure of recessed-gate-type nitride semiconductor device 103 in which the end portion of high resistance region 6 is inside the surface end of third nitride semiconductor layer 5, according to Variation 3 of the embodiment. Moreover, although this variation is described using a group III nitride semiconductor, the present disclosure is not limited to the group III nitride semiconductor. Furthermore, this structure shows a minimum configuration, and the present disclosure is not limited to this configuration.

Nitride semiconductor device 103 has recess 11 structure in second nitride semiconductor layer 4 under third nitride semiconductor layer 5 containing the p-type first impurity element in nitride semiconductor devices 100, 101 and 102 shown in FIGS. 1, 5 and 6. The remaining thickness of second nitride semiconductor layer 4 immediately below recess 11 is varied depending on the threshold voltage (Vth) for normally-off operation to be set. When second nitride semiconductor layer 4 is an AlGaN film having the Al composition ratio of 20%, the film thickness of the AlGaN film needs to be in the range of 10 nm to 20 nm, preferably 15 nm. Second nitride semiconductor layer 4 other than the recess portion may be thicker than the remaining thickness of second nitride semiconductor layer 4 immediately below recess 11 portion described above, preferably 40 nm or more.

In the method for manufacturing nitride semiconductor device 103, the epitaxial growth is once completed on second nitride semiconductor layer 4, and then recess 11 portion is formed in second nitride semiconductor layer 4 using a known photolithography technique and dry etching technique. Subsequently, third nitride semiconductor layer 5 containing the p-type first impurity element is epitaxially grown so as to fill recess 11, and the subsequent manufacturing method is the same as the manufacturing method in FIG. 4B. Since third nitride semiconductor layer 5 containing the p-type first impurity element needs to be formed so as to completely embed recess 11 portion by lateral growth, a certain degree of film thickness is required and it is preferably 200 nm or more at the maximum thickness portion.

By using nitride semiconductor device 103, in addition to the effects of nitride semiconductor devices 100, 101 and 102 shown in FIGS. 1, 5 and 6, two-dimensional electron gas layer 8 can be physically separated from the surface of second nitride semiconductor layer 4 other than recess 11 portion, the influence of electrons trapped in the surface level on the surface of second nitride semiconductor layer 4 can be removed, and current collapse can be greatly reduced.

Next, a nitride semiconductor device according to Variation 4 of the embodiment will be described.

Figure 8:
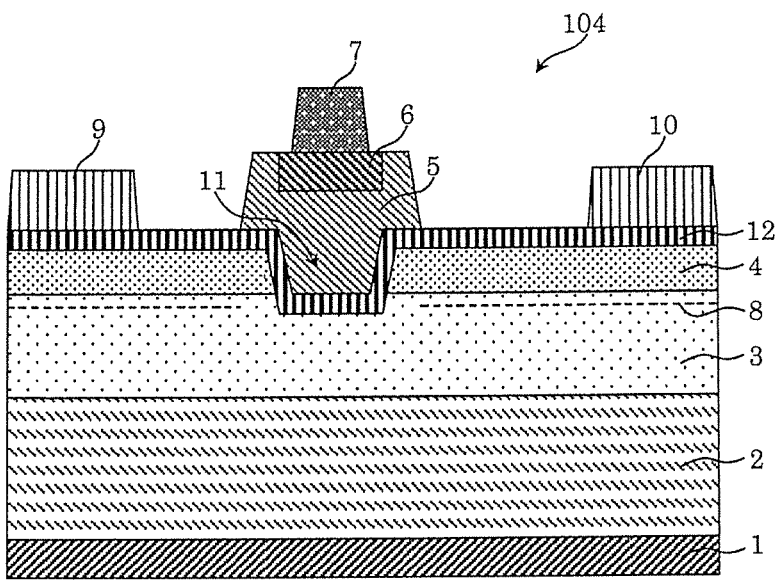
FIG. 8 is a cross-sectional view showing a cross-sectional structure of a nitride semiconductor device according to Variation 4 of the embodiment.

FIG. 8 shows a cross-sectional structure of a through-recessed-gate-type nitride semiconductor device 104 in which the end portion of high resistance region 6 is inside the surface end of third nitride semiconductor layer 5, according to Variation 4 of the embodiment. Moreover, although this embodiment is described using a group III nitride semiconductor, the present disclosure is not limited to the group III nitride semiconductor. Furthermore, this structure shows a minimum configuration, and the present disclosure is not limited to this configuration.

Nitride semiconductor device 104 has such recess 11 structure in second nitride semiconductor layer 4 under third nitride semiconductor layer 5 containing the p-type first impurity element in nitride semiconductor devices 100 and 101 to 103 shown in FIGS. 1 and 5 to 7 as to penetrate second nitride semiconductor layer 4 and has the bottom surface reaching first nitride semiconductor layer 3.

In the manufacturing method of nitride semiconductor device 104, the epitaxial growth is once completed in second nitride semiconductor layer 4 during the manufacturing process shown in FIG. 4A, and then recess 11 portion which penetrates second nitride semiconductor layer 4 and has the bottom surface reaching first nitride semiconductor layer 3 is formed by using a known photolithography technique and dry etching technique. Subsequently, fourth nitride semiconductor layer 12 such as AlGaN is grown on divided two-dimensional electron gas layer 8 by re-epitaxial growth, which reconnects divided second nitride semiconductor layer 4 and reconnects two-dimensional electron gas layer 8. Subsequently, third nitride semiconductor layer 5 containing the p-type first impurity element is epitaxially grown so as to fill recess 11, and the subsequent manufacturing method is the same as the manufacturing method in FIG. 4B.

The film thickness of regrowthing fourth nitride semiconductor layer 12 is varied depending on the threshold voltage (Vth) to be set for normally-off operation. When fourth nitride semiconductor layer 12 is an AlGaN film having the Al composition ratio of 20%, the film thickness of the AlGaN film needs to be in the range of 10 nm to 20 nm, preferably 15 nm. It is only necessary that the sum of the film thicknesses of second nitride semiconductor layer 4 and fourth nitride semiconductor layer 12 other than recess 11 portion is thicker than the remaining thickness of second nitride semiconductor layer 4 immediately below recess 11 portion described above, preferably 40 nm or more. Furthermore, third nitride semiconductor layer 5 containing the p-type first impurity element needs to be formed so as to embed recess 11 portion by lateral growth. Therefore, a certain degree of film thickness is required and it is preferably 200 nm or more at the maximum thickness portion.

By using nitride semiconductor device 104, in addition to the effects of nitride semiconductor devices 100, 101 and 102 shown in FIGS. 1, 5 and 6, two-dimensional electron gas layer 8 can be physically separated from the surface of second nitride semiconductor layer 4, the influence of electrons trapped in the surface level on the surface of fourth nitride semiconductor layer 12 can be removed, and current collapse can be greatly reduced. Furthermore, in addition to the effects of nitride semiconductor device 103 shown in FIG. 7, since Vth in the wafer surface can be controlled only by fourth nitride semiconductor layer 12 that has been regrown, the variation in Vth in the wafer surface is small.

Next, a nitride semiconductor device according to Variation 5 of the embodiment will be described.

Figure 9:
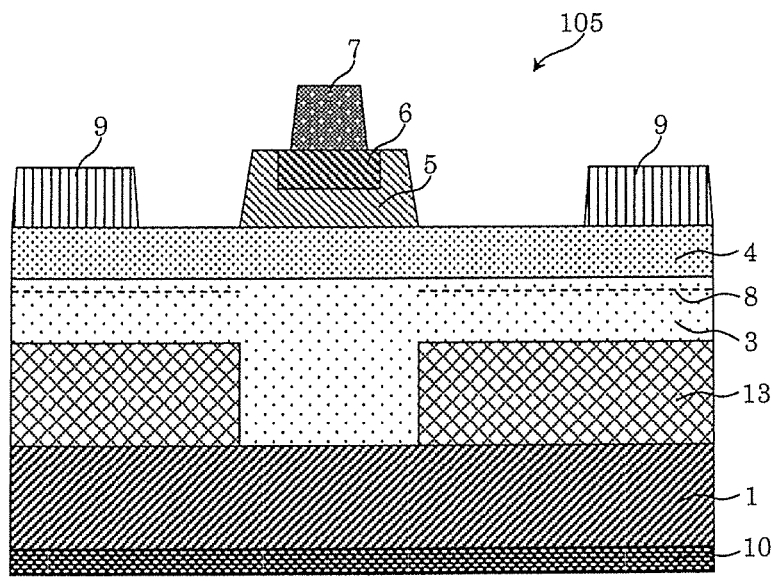
FIG. 9 is a cross-sectional view showing a cross-sectional structure of a nitride semiconductor device according to Variation 5 of the embodiment.

FIG. 9 shows a cross-sectional structure of vertical nitride semiconductor device 105 in which the end portion of high resistance region 6 is inside the surface end of third nitride semiconductor layer 5, according to Variation 5 of the embodiment. Moreover, although this embodiment is described using a group III nitride semiconductor, the present disclosure is not limited to the group III nitride semiconductor. Furthermore, this structure shows a minimum configuration, and the present disclosure is not limited to this configuration.

In this structure, among nitride semiconductor devices 100 and 101 to 104 shown in FIGS. 1 and 5 to 8, substrate 1 is made of n-type GaN, there is drain electrode 10 on the back surface of substrate 1, and there is source electrode 9 which is formed apart from gate electrode 7 on the side of gate electrode 7 on the surface side and is electrically connected to two-dimensional electron gas layer 8. Well layer 13 may be inside first nitride semiconductor layer 3. Well layer 13 may be p-type for the purpose of providing a depletion layer by forming a p-n junction with n-type substrate 1 or first nitride semiconductor layer 3 made of n-GaN since well layer 13 is inserted for the purpose of suppressing the through current between source and drain. As in FIGS. 7 and 8, recess 11 structure may be used (not shown).

By using nitride semiconductor device 105, in addition to the effects of nitride semiconductor devices 100 and 101 to 104 shown in FIGS. 1 and 5 to 8, the breakdown voltage can be increased because it is a vertical FET. Furthermore, the current density per chip area can be improved.

Figure 10:
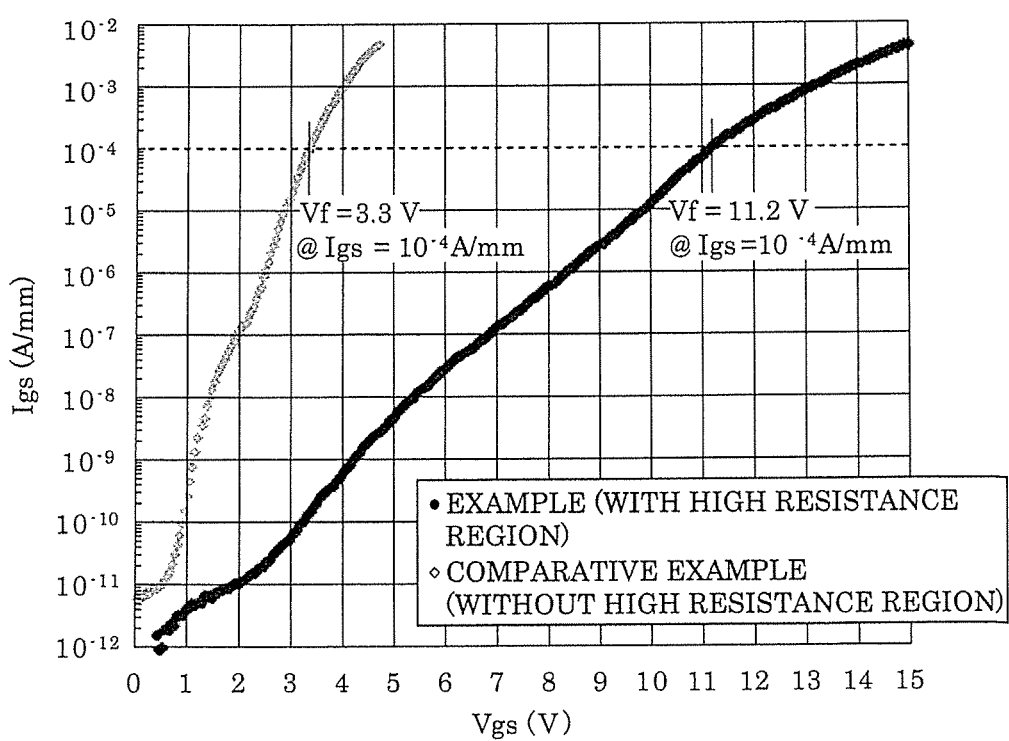
FIG. 10 is a graph showing the Vf characteristics of the nitride semiconductor devices according to an example and a comparative example.
Figure 11A:
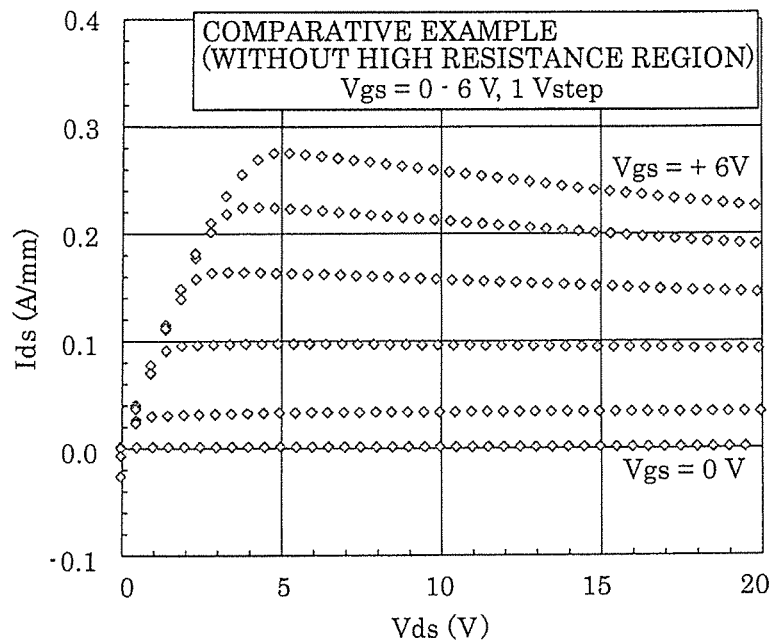
FIG. 11A is a graph showing Ids-Vds characteristics of the nitride semiconductor device according to the comparative example.
Figure 11B:
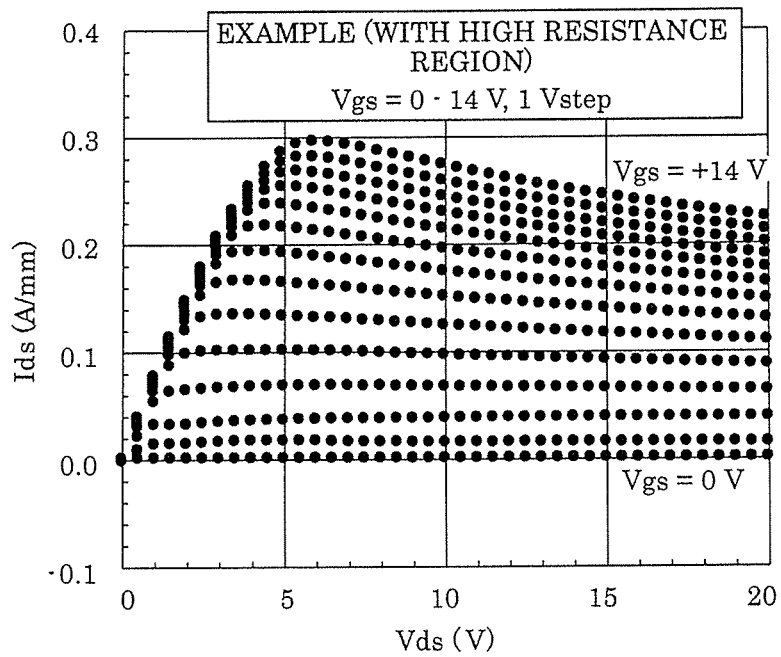
FIG. 11B is a graph showing Ids-Vds characteristics of the nitride semiconductor device according to the example.
Figure 12:
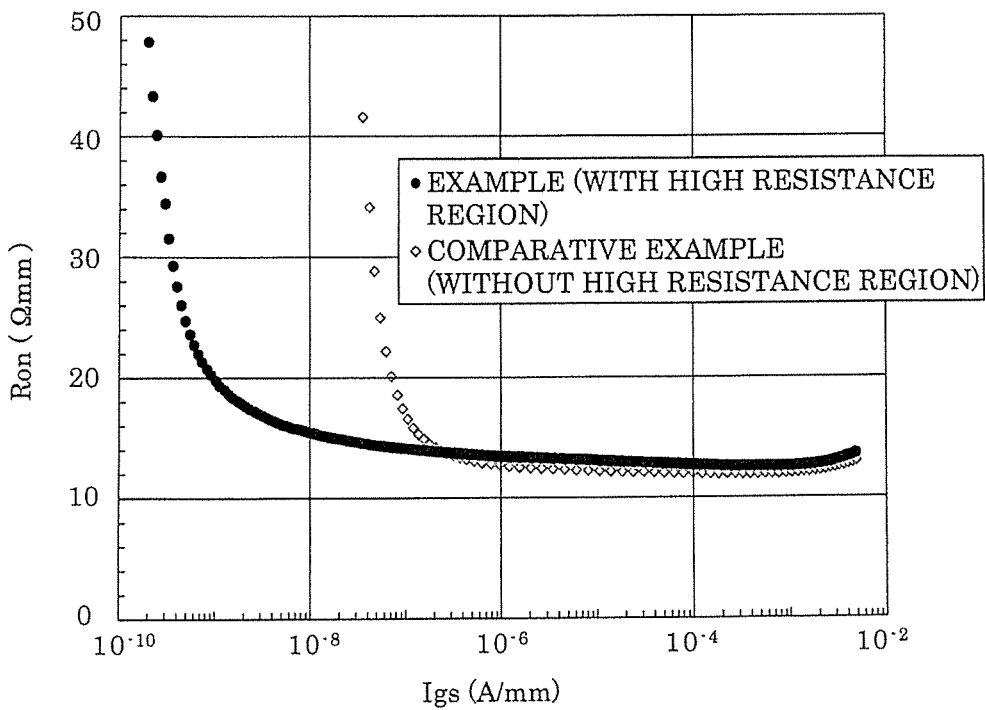
FIG. 12 is a graph showing the Ron-Igs characteristics of the nitride semiconductor devices according to the example and the comparative example.
Figure 13:
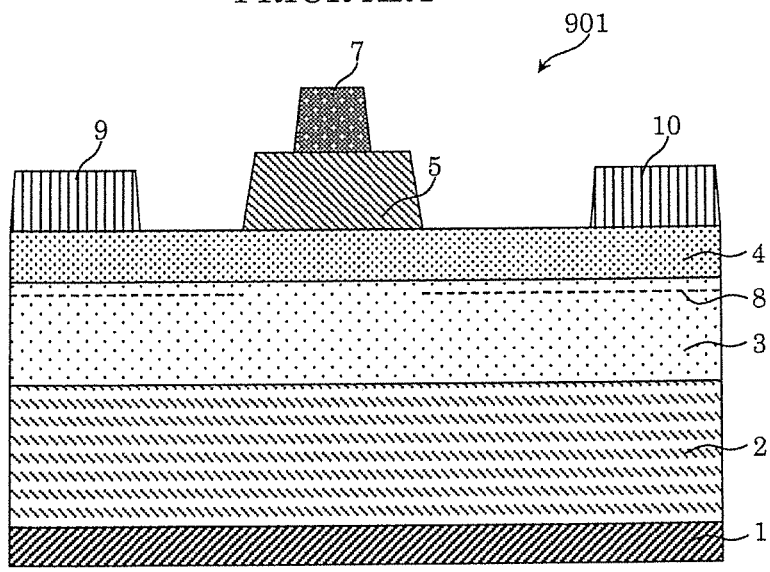
FIG. 13 is a cross-sectional view showing a cross-sectional structure of a semiconductor device disclosed in Japanese Unexamined Patent Application Publication No. 2011-29247.
Figure 14:
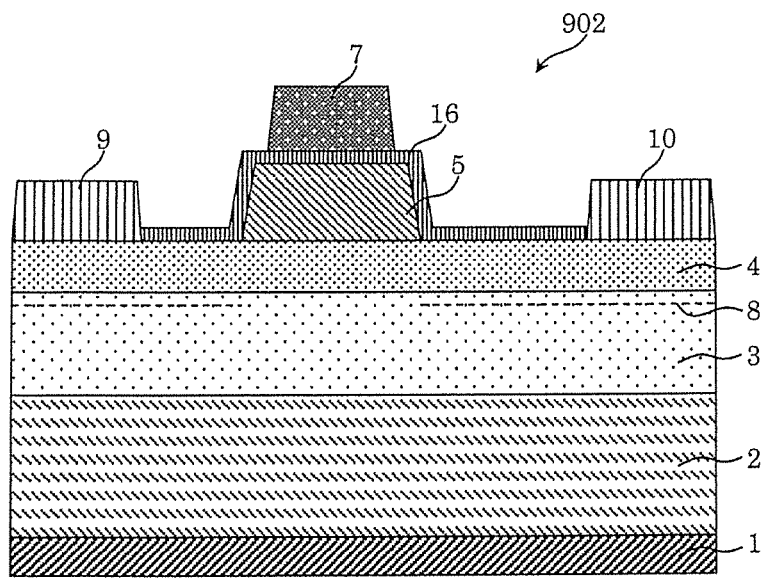
FIG. 14 is a cross-sectional view showing a cross-sectional structure of the semiconductor device disclosed in Japanese Patent No. 4041075.
Figure 15:
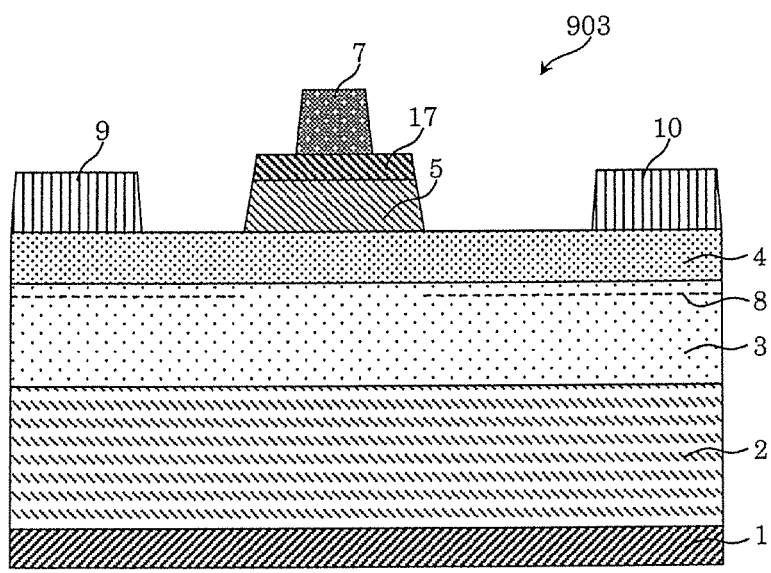
FIG. 15 is a cross-sectional view showing a cross-sectional structure of the semiconductor device disclosed in Japanese Patent No. 5707463.

FIGS. 10 to 12 show the electrical characteristics of a comparative example without high resistance region 6 and the electrical characteristics of an example with high resistance region 6 in the through-recessed-gate-type nitride semiconductor device 104 described in FIG. 8. Third nitride semiconductor layer 5 of the through-recessed-gate-type nitride semiconductor device 104 shown here is p-GaN, and the maximum film thicknesses in both the comparative example and the example are about 250 nm.

In an example having high resistance region 6, high resistance region 6 includes both B and F, the peak concentration of B is $1.3 \times 10^{19}$ cm$^{-3}$, and the peak concentration of F is $2.6 \times 10^{19}$ cm$^{-3}$. In addition, the average concentration of B contained in the entire p-GaN is $1.2 \times 10^{18}$ cm$^{-3}$, and the average concentration of F is $2.3 \times 10^{18}$ cm$^{-3}$. When a film thickness including $1 \times 10^{17}$ cm$^{-3}$ or more of the second impurity element is defined as a film thickness of high resistance region 6, the film thickness is approximately 70 nm, and the surface of high resistance region 6 and the surface of third nitride semiconductor layer 5 are in the same plane. The width of the top surface of third nitride semiconductor layer 5 is approximately 1.4 μm, the width of the top surface of high resistance region 6 is approximately 0.9 μm, and the width of the bottom surface of gate electrode 7 is approximately 0.8 μm. The bottom end of gate electrode 7 is inside the top end of high resistance region 6, and the bottom end of gate electrode 7 is all in contact with the top surface of high resistance region 6.

FIG. 10 shows Vgs-Igs (Vf) characteristics of a comparative example in which third nitride semiconductor layer 5 does not have high resistance region 6 and an example in which third nitride semiconductor layer 5 has high resistance region 6 in nitride semiconductor device 104. According to the example, the presence of high resistance region 6 greatly improves Vf from 3.3 V in the comparative example to 11.2 V. As a result, the requirement of Vf≥7V is satisfied, and a GaN-FET can be driven by a driver for a silicon-based MOSFET on a silicon-based MOSFET circuit for power use.

In addition, FIGS. 11A and 11B show the Ids-Vds characteristics of the comparative example in which third nitride semiconductor layer 5 does not have high resistance region 6 and the example in which third nitride semiconductor layer 5 has high resistance region 6 in nitride semiconductor device 104, respectively. In both the comparative example and the example, a maximum drain current (Imax) of about 0.3 A/mm can be secured, and they operates normally as FETs. Furthermore, since Vf can be secured to 11 V or more in the example having high resistance region 6, even if Vgs of +14 V is applied, Ids does not leak and it can operate normally as a FET.

In addition, FIG. 12 shows Ron-Igs characteristics of the comparative example in which third nitride semiconductor layer 5 does not have high resistance region 6 in nitride semiconductor device 104 and the example in which high resistance region 6 is provided. In the example with high resistance region 6, a low Ron can be obtained at a lower Igs than in the comparative example without high resistance region 6. That is, the switching operation can be performed with lower power consumption, and the switching loss on the circuit can be reduced.

As described above, the nitride semiconductor devices according to one or more aspects of the present disclosure have been described based on the embodiment, but the present disclosure is not limited to this embodiment. Unless it departs from the spirit of the present disclosure, embodiments in which various variations that can be conceived by those skilled in the art are applied to the present embodiment, or embodiments which are constructed by combining components in different embodiments may be also included within the scope of one or more aspects of the present disclosure. Those skilled in the art will readily appreciate that many modifications are possible in the exemplary embodiment without materially departing from the novel teachings and advantages of the present disclosure. Accordingly, all such modifications are intended to be included within the scope of the present disclosure.

INDUSTRIAL APPLICABILITY

The present disclosure can provide a semiconductor device that can greatly improve Vf simultaneously with the normally-off operation, thereby improving the performance of the power device.

What is claimed is:

1. A nitride semiconductor device, comprising:
a substrate;
a first nitride semiconductor layer disposed above the substrate;
a second nitride semiconductor layer disposed above the first nitride semiconductor layer and having a band gap larger than a band gap of the first nitride semiconductor layer;
a third nitride semiconductor layer selectively disposed above the second nitride semiconductor layer and containing a p-type first impurity element;
a high resistance region disposed in the third nitride semiconductor layer, the high resistance region containing a second impurity element and having a specific resistance higher than a specific resistance of the third nitride semiconductor layer; and
a gate electrode disposed above the high resistance region, wherein
an end of the high resistance region is inside a surface end of the third nitride semiconductor layer, and
an uppermost surface of the high resistance region is at a height to an uppermost surface of the substrate which is the same or lower than a height of an uppermost surface of the third nitride semiconductor layer relative to the uppermost surface of the substrate.

2. The nitride semiconductor device according to claim 1, wherein the gate electrode and the high resistance region are in contact with each other.

3. The nitride semiconductor device according to claim 2, wherein a width of the gate electrode is narrower than a width of the high resistance region.

4. The nitride semiconductor device according to claim 2, wherein a width of the gate electrode is equal to a width of the high resistance region.

5. The nitride semiconductor device according to claim 2, wherein a width of the gate electrode is wider than a width of the high resistance region.

6. The nitride semiconductor device according to claim 1, wherein a gate-source voltage at which a forward current between the gate electrode and the source electrode per gate width of the nitride semiconductor device is 100 μA/mm is 7 V or more.

7. The nitride semiconductor device according to claim 1, wherein a contact resistance between the high resistance region and the gate electrode is 200 ωmm or more.

8. The nitride semiconductor device according to claim 1, wherein a peak concentration of the second impurity element in the high resistance region is $2\times10^{18}$ cm$^{-3}$ or more.

9. The nitride semiconductor device according to claim 1, wherein
an average concentration of the second impurity element in the third nitride semiconductor layer is $1\times10^{17}$ cm$^{-3}$ or more.

10. The nitride semiconductor device according to claim 1, wherein the high resistance region has a thickness of 20 nm or more.

11. The nitride semiconductor device according to claim 1, wherein a thickness of the high resistance region is 20 nm or more, and a peak concentration of the second impurity element in the high resistance region is $2\times10^{18}$ cm$^{-3}$ or more.

12. The nitride semiconductor device according to claim 1, wherein a thickness of the high resistance region is less than a maximum thickness of the third nitride semiconductor layer.

13. The nitride semiconductor device according to claim 1, wherein
a lower end of the high resistance region is 10 nm or more above a lower end of the third nitride semiconductor layer.

14. The nitride semiconductor device according to claim 1, wherein
the second impurity element is at least one of F, B, Ar, He, Cr, Zn, Ca and Ti.

15. The nitride semiconductor device according to claim 1, wherein
the gate electrode uses a material that is in ohmic contact with the third nitride semiconductor.

16. The nitride semiconductor device according to claim 15, wherein
the gate electrode includes at least one element of Ni, Pt, Pd, Au, Ti, Cr, In and Sn.

17. The nitride semiconductor device according to claim 1, wherein
a side surface of the third nitride semiconductor layer is exposed.

18. The nitride semiconductor device according to claim 1, wherein
a difference between impurity elements in the third nitride semiconductor layer and impurity elements in the high resistance region is only the second impurity element.

19. The nitride semiconductor device according to claim 1, wherein the uppermost surface of the high resistance region is at a same height relative to the uppermost surface of the substrate as the uppermost surface of the third nitride semiconductor layer.

* * * * *